United States Patent
Shigematsu

(10) Patent No.: US 10,062,501 B2
(45) Date of Patent: Aug. 28, 2018

(54) ESD PROTECTION DEVICE AND COMMON MODE CHOKE COIL WITH BUILT-IN ESD PROTECTION DEVICE

(71) Applicant: Murata Manufacturing Co., Ltd., Nagaokakyo-shi, Kyoto-fu (JP)

(72) Inventor: Satoshi Shigematsu, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 207 days.

(21) Appl. No.: 15/236,619

(22) Filed: Aug. 15, 2016

(65) Prior Publication Data

US 2016/0351327 A1    Dec. 1, 2016

Related U.S. Application Data

(63) Continuation of application No. PCT/JP2015/078716, filed on Oct. 9, 2015.

(30) Foreign Application Priority Data

Nov. 19, 2014    (JP) .................................. 2014-234127

(51) Int. Cl.
*H02H 1/00* (2006.01)
*H01F 27/40* (2006.01)
(Continued)

(52) U.S. Cl.
CPC ............. *H01F 27/402* (2013.01); *H01C 7/12* (2013.01); *H01F 17/00* (2013.01); *H01F 27/00* (2013.01);
(Continued)

(58) Field of Classification Search
USPC .................................. 361/117–119, 212, 220
See application file for complete search history.

(56) References Cited

U.S. PATENT DOCUMENTS

| | | |
|---|---|---|
| 2009/0067113 A1 | 3/2009 | Urakawa |
| 2010/0176484 A1 | 7/2010 | Asakura et al. |
| 2011/0007438 A1 | 1/2011 | Ito et al. |
| 2011/0038088 A1 | 2/2011 | Noma et al. |
| 2013/0163130 A1* | 6/2013 | Yamada ................. H01T 4/12 361/56 |
| 2014/0240878 A1* | 8/2014 | Otsubo ................. H01T 4/12 361/56 |

(Continued)

FOREIGN PATENT DOCUMENTS

| | | |
|---|---|---|
| JP | 2010-108746 A | 5/2010 |
| JP | 2010-186742 A | 8/2010 |

(Continued)

OTHER PUBLICATIONS

Official Communication issued in International Patent Application No. PCT/JP2015/078716, dated Dec. 28, 2015.

*Primary Examiner* — Danny Nguyen
(74) *Attorney, Agent, or Firm* — Keating & Bennett, LLP

(57) ABSTRACT

An ESD protection device includes a multilayer body including base material layers, a hollow portion inside the multilayer body, a ground electrode exposed at the hollow portion, first and second discharge electrodes exposed at the shared hollow portion and opposing the common ground electrode, and an auxiliary discharge electrode including conductive particles dispersed in the base material layer and extending along an inner surface of the hollow portion. At least the auxiliary discharge electrode in an adjacent region between the first discharge electrode and the second discharge electrode is divided into a portion on the first discharge electrode side and a portion on the second discharge electrode side by a non-formation section where the auxiliary discharge electrode is not provided in the hollow portion.

19 Claims, 13 Drawing Sheets

(51) Int. Cl.
*H01C 7/12* (2006.01)
*H01F 17/00* (2006.01)
*H01F 27/00* (2006.01)
*H01T 4/10* (2006.01)
*H01F 27/29* (2006.01)
*H05F 3/04* (2006.01)
*H01T 4/08* (2006.01)
*H05K 1/02* (2006.01)
*H01T 4/12* (2006.01)

(52) U.S. Cl.
CPC ............. *H01F 27/292* (2013.01); *H01T 4/08* (2013.01); *H01T 4/10* (2013.01); *H05F 3/04* (2013.01); *H05K 1/026* (2013.01); *H01T 4/12* (2013.01); *H05K 1/0259* (2013.01)

(56) References Cited

U.S. PATENT DOCUMENTS

2014/0306787 A1   10/2014  Kato et al.
2014/0368307 A1   12/2014  Kato

FOREIGN PATENT DOCUMENTS

| | | |
|---|---|---|
| JP | 2011-176338 A | 9/2011 |
| JP | 2011-181512 A | 9/2011 |
| WO | 2008/146514 A1 | 12/2008 |
| WO | 2009/136535 A1 | 11/2009 |
| WO | 2013/099540 A1 | 7/2013 |
| WO | 2013/136936 A1 | 9/2013 |

* cited by examiner

ESD PROTECTION DEVICE AND COMMON MODE CHOKE COIL WITH BUILT-IN ESD PROTECTION DEVICE

CROSS REFERENCE TO RELATED APPLICATIONS

This application claims the benefit of priority to Japanese Patent Application 2014-234127 filed Nov. 19, 2014 and is a Continuation Application of PCT/JP2015/078716 filed on Oct. 9, 2015. The entire contents of each application are hereby incorporated herein by reference.

BACKGROUND OF THE INVENTION

1. Field of the Invention

The present invention relates to an ESD protection device, and a common mode choke coil with a built-in ESD protection device including an integral structure including an ESD protection device and a common mode choke coil in a multilayer body.

2. Description of the Related Art

ESD (electro-static discharge) is a phenomenon in which discharge occurs when an electrically-charged conductive substance (a human body, connector, or the like) makes contact with or comes close enough to another conductive substance (an electronic apparatus or the like). ESD protection devices are configured to release ESD to the ground or the like and disposed, for example, between a signal line in a circuit and the ground (earth).

To prevent damage, malfunctions, and so on of electronic apparatuses caused by ESD, a variety of ESD protection devices have been conceived as a counter measure against ESD. For example, International Publication No. WO 2008/146514 discloses an ESD protection device (spark gap type) having a configuration in which there are provided, in a hollow portion provided inside a multilayer body, a discharge electrode and a ground electrode opposing each other, and an auxiliary electrode that is disposed adjacent to the discharge and ground electrodes opposing each other.

Meanwhile, to suppress common mode noise that propagates in differential transmission lines, common mode choke coils have been generally used as common mode filters, and a variety of common mode choke coils with a built-in ESD protection device of the spark gap type have been conceived as a countermeasure against ESD. For example, in each of International Publication No. WO 2013/136936 and International Publication No. WO 2013/99540, there is disclosed a lamination-type common mode choke coil of an array type having a structure in which two hollow portions are arranged on the right and left sides when viewed in a lamination direction, and ESD protection devices are separately formed in each of the hollow portions.

In the case where a multilayer body having a structure in which ESD protection devices are separately formed in each hollow portion is miniaturized, there arises a problem such that a plurality of hollow portions are disposed nearby each other and consequently the hollow portions are connected to each other. Because of this, in the structure where the hollow portions are individually provided for each ESD protection device, a certain amount of occupation space needs to be secured, which makes it difficult to realize the miniaturization. Accordingly, in order to miniaturize an electronic component including a plurality of ESD protection devices inside a multilayer body, it is essential to use a structure in which a ground electrode and a plurality of discharge electrodes are disposed in a single hollow portion.

However, in the case where the above structure is used, when static electricity enters a transmission line, in addition to the occurrence of discharge between the discharge electrode and the ground electrode, abnormal discharge among the plurality of discharge electrodes is likely to occur because the plurality of discharge electrodes are arranged adjacent to each other in the shared hollow portion. In the case where the discharge among the discharge electrodes (hereinafter, referred to as "abnormal discharge") occurs, the static electricity having entered one transmission line moves to another transmission line, which raises a risk of breakdown of an electronic circuit such as an IC or the like that is connected to a subsequent stage of a common mode choke coil.

SUMMARY OF THE INVENTION

Preferred embodiments of the present invention provide a miniaturized ESD protection device of a spark gap type, in which discharge among a plurality of discharge electrodes is significantly reduced or prevented even if a plurality of ESD protection devices are provided in a shared hollow portion. Preferred embodiments of the present invention also provide a common mode choke coil including such an ESD protection device.

An ESD protection device according to a preferred embodiment of the present invention includes a multilayer body including a plurality of base material layers laminated in a lamination direction; a hollow portion provided inside the multilayer body; a ground electrode at least a portion of which is exposed at the hollow portion; a first discharge electrode and a second discharge electrode which oppose the common ground electrode, and at least a portion of which are exposed at the shared hollow portion; and an auxiliary discharge electrode which includes conductive particles dispersed in the base material layer, at least a portion of which is exposed at the hollow portion, and which is provided along an inner surface of the hollow portion, wherein the first discharge electrode and the second discharge electrode are disposed adjacent to each other in the hollow portion when viewed in a lamination direction of the base material layers, the auxiliary discharge electrode is formed at least in an opposing region between the first discharge electrode and the ground electrode as well as an opposing region between the second discharge electrode and the ground electrode, and includes a non-formation section where the auxiliary discharge electrode is not provided in the hollow portion, when viewed in the lamination direction, and the non-formation section divides at least the auxiliary discharge electrode in an adjacent region between the first discharge electrode and the second discharge electrode into a portion on the first discharge electrode side and a portion on the second discharge electrode side.

With this configuration, a plurality of ESD protection devices are provided in the shared hollow portion which is inside the multilayer body, which makes it possible to realize miniaturization in comparison with the conventional structure in which ESD protection devices are separately formed in each of the hollow portions. Further, with this configuration, static electricity having entered a transmission line is likely to be discharged between the first discharge electrode and the ground electrode as well as between the second discharge electrode and the ground electrode. Furthermore, since at least the auxiliary discharge electrode in the adjacent region between the first discharge electrode and the second discharge electrode is divided by the non-formation section, into the portion on the first discharge electrode side and the portion on the second discharge electrode side, the discharge among the plurality of discharge electrodes disposed adjacent to each other in the hollow portion is significantly reduced or prevented. Therefore, static electricity having entered one transmission line is prevented from moving to another transmission line.

It is preferable that a clearance of the opposing region between the first discharge electrode and the ground electrode as well as a clearance of the opposing region between the second discharge electrode and the ground electrode be shorter than a distance of the adjacent region between the first discharge electrode and the second discharge electrode. With this configuration, because static electricity having entered a transmission line is likely to be discharged between the first discharge electrode and the ground electrode as well as between the second discharge electrode and the ground electrode, the discharge among the plurality of discharge electrodes disposed adjacent to each other in the hollow portion is significantly reduced or prevented.

It is preferable for the non-formation section to divide the auxiliary discharge electrode into a portion on the first discharge electrode side and a portion on the second discharge electrode side. In this configuration, because the auxiliary discharge electrode is divided, by the non-formation section, into the portion on the first discharge electrode side and the portion on the second discharge electrode side, the discharge among the plurality of discharge electrodes disposed adjacent to each other in the hollow portion is significantly reduced or prevented.

It is preferable for the auxiliary discharge electrode to extend at least beyond outer edges of the first discharge electrode and the second discharge electrode that are exposed at the hollow portion when viewed in the lamination direction of the base material layers. With this configuration, because the auxiliary discharge electrode extends beyond the outer edges of the first discharge electrode and second discharge electrode exposed at the hollow portion, a variation in ESD protection characteristics is significantly reduced or prevented even if a lamination shift occurs in the manufacturing. This makes it possible to improve a non-defective product rate by reducing the influence of the lamination shift. Further, because the auxiliary discharge electrode is also provided in a region other than the opposing region between the first discharge electrode and the ground electrode as well as the opposing region between the second discharge electrode and the ground electrode, an area of the auxiliary discharge electrode becomes large. Accordingly, with this configuration, a large number of discharge paths for static electricity are provided, such that deterioration in insulation resistance is unlikely to occur even if the discharge of static electricity repeatedly occurs, and characteristics for the repetition of static electricity discharge are improved.

A common mode choke coil with a built-in ESD protection device according to a preferred embodiment of the present invention includes a first coil and a second coil coupled to each other and the ESD protection device described in any one of the above-described preferred embodiments of the present invention connected to the first coil and the second coil, on a surface of or inside the multilayer body.

In a common mode choke coil with a built-in ESD protection device according to a preferred embodiment of the present invention, it is preferable for the ESD protection device to be provided at an inner side of a coil cavity of the first coil and the second coil in planar view in a winding axis direction of the first coil and the second coil. In this configuration, because the ground electrode, the discharge electrodes, and the auxiliary discharge electrode are provided at the inner side of the coil cavity, it is possible to prevent the generation of a recess, which is generated during calcination of the multilayer body, in a region of the inner side of the loop-shaped first and second coils in comparison with a case where no electrode pattern is provided at the inner side of the coil cavity. With this, a lamination-type common mode choke coil with a built-in ESD protection device having a high level of flatness on a top surface and a bottom surface is provided. Further, since the ground electrode, the discharge electrodes, and the auxiliary discharge electrode are provided at the inner side of the coil cavity, it is possible to significantly reduce or prevent the generation of unnecessary capacitance between a first loop conductor of the first coil and a second loop conductor of the second coil. Furthermore, since a distance between a discharge gap of the ESD protection device and the loop conductor configuring each coil is long, the loop conductor is unlikely to be affected by electromagnetic induction, heat, or the like, caused by the ESD.

In a common mode choke coil with a built-in ESD protection device according to a preferred embodiment of the present invention, it is preferable that a line width of a portion of the ground electrode that overlaps with the first coil and the second coil be thinner than a line width of a portion thereof exposed at the hollow portion when viewed in the lamination direction of the base material layers. With this configuration, an opposing area between the ground electrode and the conductors forming the first coil and the second coil is able to be made small. This makes it possible to reduce stray capacitance generated between the ground electrode and the conductors of the first coil and the second coil.

According to various preferred embodiments of the present invention, a miniaturized ESD protection device of a spark gap type in which abnormal discharge among a plurality of discharge electrodes is significantly reduced or prevented even if a plurality of ESD protection devices are provided in a shared hollow portion, and a common mode choke coil with a built-in ESD protection device are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
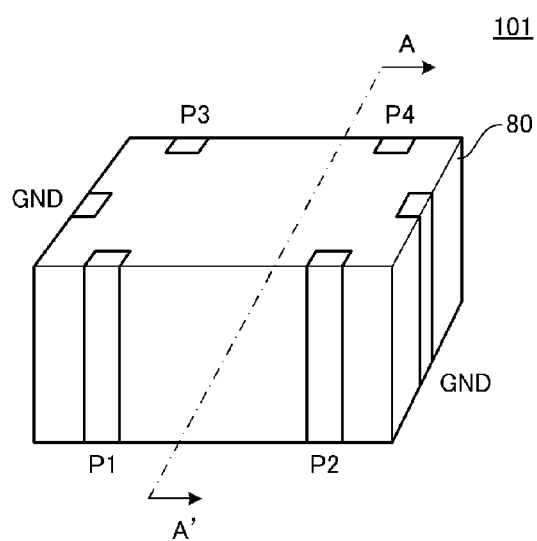
FIG. 1 is a perspective view of exterior appearance of a common mode choke coil with a built-in ESD protection device 101 according to a first preferred embodiment of the present invention.

Hereinafter, several specific examples will be explained with reference to the drawings so as to describe a plurality of preferred embodiments of the present invention. In the drawings, identical constituent elements are assigned the same reference signs. The preferred embodiments are merely examples, and configurations described in different preferred embodiments can partially replace each other or be combined as well.

First Preferred Embodiment

Figure 2:
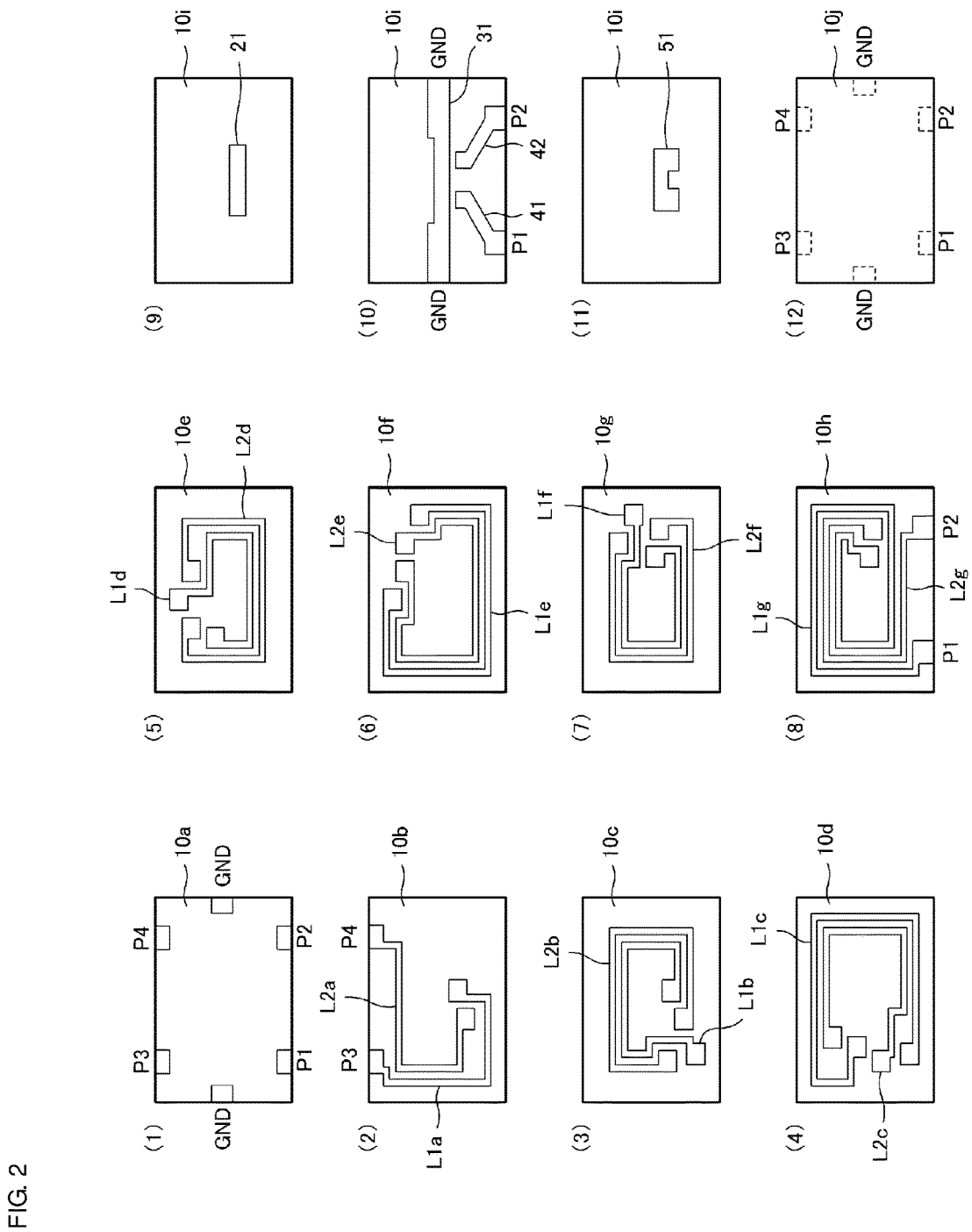
FIG. 2 includes exploded plan views illustrating an electrode pattern and the like of each base material layer of the common mode choke coil with a built-in ESD protection device 101 according to the first preferred embodiment of the present invention.
Figure 3:
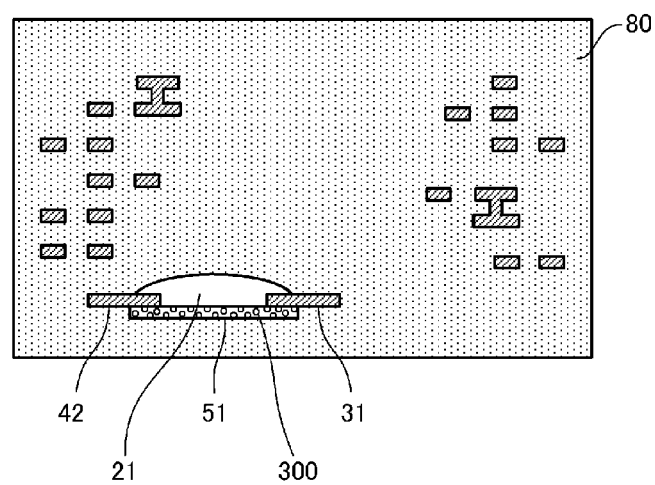
FIG. 3 is a cross-sectional view taken along an A-A' line in FIG. 1.

A common mode choke coil with a built-in ESD (electrostatic discharge) protection device according to a first preferred embodiment of the present invention will be described with reference to the drawings. FIG. 1 is a perspective view of exterior appearance of a common mode choke coil with a built-in ESD protection device 101 according to the first preferred embodiment. FIG. 2 includes exploded plan views illustrating an electrode pattern and the like of each base material layer of the common mode choke coil with a built-in ESD protection device 101 according to the first preferred embodiment. FIG. 3 is a cross-sectional view taken along an A-A' line in FIG. 1. In FIG. 3, in order to facilitate understanding of the drawing and operation principle, the structure of the common mode choke coil with a built-in ESD protection device 101 is illustrated in a simplified manner. Note that in FIG. 3, thicknesses of the respective portions are illustrated in an exaggerated manner. The same is applied to side views in the following preferred embodiments.

The common mode choke coil with a built-in ESD protection device 101 includes a multilayer body 80, a first coil L1 and a second coil L2 coupled to each other and inside the multilayer body 80, and an ESD protection device. The ESD protection device is, as will be described in detail later, provided in a hollow portion 21 that is inside the multilayer body 80. The multilayer body 80 preferably has a rectangular or substantially rectangular parallelepiped shape and is preferably formed by laminating a plurality of base material layers 10a through 10j as shown in FIGS. 2(1) through 2(12).

In FIG. 2, (1) illustrates an uppermost layer and (12) illustrates a lowermost layer. As shown in FIG. 2, an input-output terminal P1, an input-output terminal P2, an input-output terminal P3, and an input-output terminal P4 are provided in the base material layer 10a and the base material layer 10j.

In the base material layer 10b, a first loop conductor L1a and a second loop conductor L2a are counterclockwise wound in a bifilar manner while both the conductors taking the center of the base material layer as a winding axis. The first loop conductor L1a is wound at an outer side portion of the second loop conductor L2a, and the second loop conductor L2a is be wound at an inner side portion of the first loop conductor L1a. One end of the first loop conductor L1a is connected to the input-output terminal P3, and the other end of the first loop conductor L1a is connected to one end of a first loop conductor L1b through a via electrode. One end of the second loop conductor L2a is connected to the input-output terminal P4, and the other end of the second loop conductor L2a is connected to one end of a second loop conductor L2b through a via electrode (or an interlayer connection conductor or the like; the same is applied hereinafter).

In the base material layer 10c, the first loop conductor L1b and the second loop conductor L2b are counterclockwise wound in a bifilar manner while both the conductors taking the center of the base material layer as a winding axis. The first loop conductor L1b and the second loop conductor L2b, which are counterclockwise wound, are in parallel or substantially in parallel to each other. Note that the first loop conductor L1b is wound at an inner side portion of the second loop conductor L2b, and the second loop conductor L2b is wound at an outer side portion of the first loop conductor L1b. The one end of the first loop conductor L1b is connected to the other end of the first loop conductor L1a through a via electrode, and the other end of the first loop conductor L1b is connected to one end of a first loop conductor L1c through a via electrode. The one end of the second loop conductor L2b is connected to the other end of the second loop conductor L2a through a via electrode, and the other end of the second loop conductor L2b is connected to one end of a second loop conductor L2c through a via electrode.

In the base material layer 10d, the first loop conductor L1c and the second loop conductor L2c are counterclockwise wound in a bifilar manner while both the conductors taking the center of the base material layer as a winding axis. The first loop conductor L1c is wound at an outer side portion of the second loop conductor L2c, and the second loop conductor L2c is wound at an inner side portion of the first loop conductor L1c. The one end of the first loop conductor L1c is connected to the other end of the first loop conductor L1b through a via electrode, and the other end of the first loop conductor L1c is connected to one end of a first loop conductor L1d through a via electrode. The one end of the second loop conductor L2c is connected to the other end of the second loop conductor L2b through a via electrode, and the other end of the second loop conductor L2c is connected to one end of a second loop conductor L2d through a via electrode.

In the base material layer 10e, the first loop conductor L1d and the second loop conductor L2d are counterclockwise wound in a bifilar manner while both the conductors taking the center of the base material layer as a winding axis. The first loop conductor L1d is wound at an inner side portion of the second loop conductor L2d, and the second loop conductor L2d is wound at an outer side portion of the first loop conductor L1d. The one end of the first loop conductor L1d is connected to the other end of the first loop conductor L1c through a via electrode, and the other end of the first loop conductor L1d is connected to one end of a first loop conductor Lie through a via electrode. The one end of the second loop conductor L2d is connected to the other end of the second loop conductor L2c through a via electrode, and the other end of the second loop conductor L2d is connected to one end of a second loop conductor L2e through a via electrode.

In the base material layer 10f, the first loop conductor Lie and the second loop conductor L2e are counterclockwise wound in a bifilar manner while both the conductors taking the center of the base material layer as a winding axis. The first loop conductor Lie is wound at an outer side portion of the second loop conductor L2e, and the second loop conductor L2e is wound at an inner side portion of the first loop conductor Lie. The one end of the first loop conductor Lie is connected to the other end of the first loop conductor L1d through a via electrode, and the other end of the first loop conductor Lie is connected to one end of a first loop conductor L1f through a via electrode. The one end of the second loop conductor L2e is connected to the other end of the second loop conductor L2d through a via electrode, and the other end of the second loop conductor L2e is connected to one end of a second loop conductor L2f through a via electrode.

In the base material layer 10g, the first loop conductor L1f and the second loop conductor L2f are counterclockwise wound in a bifilar manner while both the conductors taking the center of the base material layer as a winding axis. The first loop conductor L1f is wound at an inner side portion of the second loop conductor L2f, and the second loop conductor L2f is wound at an outer side portion of the first loop conductor L1f. The one end of the first loop conductor L1f is connected to the other end of the first loop conductor Lie through a via electrode, and the other end of the first loop conductor L1f is connected to one end of a first loop conductor L1g through a via electrode. The one end of the second loop conductor L2f is connected to the other end of the second loop conductor L2e through a via electrode, and the other end of the second loop conductor L2f is connected to one end of a second loop conductor L2g through a via electrode.

In the base material layer 10h, the first loop conductor L1g and the second loop conductor L2g are counterclockwise wound in a bifilar manner while both the conductors taking the center of the base material layer as a winding axis. The first loop conductor L1g is wound at an outer side portion of the second loop conductor L2g, and the second loop conductor L2g is wound at an inner side portion of the first loop conductor L1g. The one end of the first loop conductor L1g is connected to the other end of the first loop conductor L1f through a via electrode, and the other end of the first loop conductor L1g is connected to the input-output terminal P1. The one end of the second loop conductor L2g is connected to the other end of the second loop conductor L2f through a via electrode, and the other end of the second loop conductor L2g is connected to the input-output terminal P2.

In FIG. 2, (9) through (11) illustrate the configuration of the base material layer 10i. In the base material layer 10i, an auxiliary discharge electrode 51 is near the center of the base material layer. The auxiliary discharge electrode 51 includes a conductive material in the form of particles dispersed in the base material of the multilayer body, and at least a portion thereof is exposed at the hollow portion 21; and the electrode extends along an inner surface of the hollow portion 21. As shown in FIG. 2, the auxiliary discharge electrode 51 of the present preferred embodiment preferably has a square or substantially square shape with one side open ("c" shape).

In addition, in the base material layer 10i, a ground electrode 31, a first discharge electrode 41, and a second discharge electrode 42 are provided. The ground electrode 31 linearly extends from one short side toward another short side of the base material layer, and is connected to ground terminals GND on both short sides of the multilayer body 80. The ground electrode 31 includes a portion exposed at the hollow portion 21. The first discharge electrode 41 extends from one long side of the base material layer (a long side on the lower side in FIG. 2) toward the vicinity of the center of the base material layer. One end of the first discharge electrode 41 is connected to the input-output terminal P1, while the other end of the first discharge electrode 41 is exposed at the hollow portion 21 and includes a portion that comes close to and opposes the ground electrode 31 near the center of the base material layer. The second discharge electrode 42 extends from the one long side of the base material layer (the long side on the lower side in FIG. 2) toward the vicinity of the center of the base material layer. One end of the second discharge electrode 42 is connected to the input-output terminal P2, while the other end of the second discharge electrode 42 is exposed at the hollow portion 21 and includes a portion that comes close to and opposes the ground electrode 31 near the center of the base material layer. In the present preferred embodiment, the first discharge electrode 41 and the second discharge electrode 42 are right-left symmetric with respect to a long-side direction of the base material layer.

Further, in the base material layer 10i, the rectangular or substantially rectangular hollow portion 21 is near the center of the base material layer.

As shown in FIG. 1, the multilayer body 80 includes, on its outer surface, the input-output terminal P1, the input-output terminal P2, the input-output terminal P3, the input-output terminal P4, and the ground terminals GND.

As a material of the base material layer, in the case of providing an HF band common mode choke coil, it is preferable to use a magnetic material (a dielectric material with large magnetic permeability) in the light of magnetic energy confinement because eddy-current loss is relatively small. As such magnetic material, a high-frequency ferrite magnetic material such as a hexagonal ferrite or the like may be used. Meanwhile, in the case of providing a UHF band common mode choke coil, for example, it is preferable to use a dielectric material with high electric insulation resistance so as to significantly reduce or prevent eddy-current loss in a high frequency region. Since the magnetic permeability of a magnetic material represented by ferrite depends on a frequency, loss becomes larger as a frequency band in use becomes higher. However, a dielectric material has a relatively small frequency dependence, which makes it possible to realize a lamination-type common mode choke coil with small loss in a wide frequency range. In other words, in a common mode choke coil that is used in a wide band, particularly, in a high-speed interface including a high frequency band, it is preferable to use a dielectric material layer, which is a non-magnetic material layer, as a base material layer.

The base material layer may be a dielectric ceramic layer such as a layer of low temperature co-fired ceramics (LTCC), or a resin layer formed of a thermoplastic resin, thermosetting resin, or the like. In other words, the multilayer body may be a ceramic multilayer body or a resin multilayer body. Further, it is preferable that the loop conductors and interlayer connection electrodes defining the coils, surface electrodes provided on a surface of the multilayer body, and the like use a metallic material whose main ingredient is a metal with small specific resistance such as copper, silver, or the like.

The first coil L1 includes the first loop conductor L1a, the first loop conductor L1b, the first loop conductor L1c, the first loop conductor L1d, the first loop conductor L1e, the first loop conductor L1f, the first loop conductor L1g, and the via electrodes connecting these loop conductors. The second coil L2 includes the second loop conductor L2a, the second loop conductor L2b, the second loop conductor L2c, the second loop conductor L2d, the second loop conductor L2e, the second loop conductor L2f, the second loop conductor L2g, and the via electrodes connecting these loop conductors. The first coil L1 and the second coil L2 are coupled to each other in a direction to block a common mode current, so as to define and function as a common mode choke coil.

In the present preferred embodiment, when the interlayer connection is performed, using the via electrodes, on the first and second loop conductors bifilarly wound in the base material layers, arrangement positions of the first and second loop conductors are switched every layer between the inner and outer sides relative to each other. With this, the first coil L1 and the second coil L2 include the electrodes having the same or approximately the same length. This makes it possible to secure the symmetry between the first coil L1 and the second coil L2 and raise the degree of coupling of the common mode choke coil. Note that the common mode choke coil is not limited to the configuration of the present preferred embodiment. The winding directions, the number of turns, the configurations, and so on of the first coil L1 and the second coil L2 can be appropriately modified.

Figure 4:
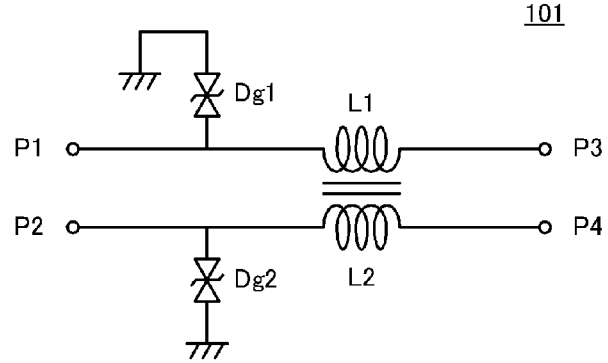
FIG. 4 is a circuit diagram of the common mode choke coil with a built-in ESD protection device 101 according to the first preferred embodiment of the present invention.

FIG. 4 is a circuit diagram of the common mode choke coil with a built-in ESD protection device 101 according to the first preferred embodiment.

As shown in FIG. 4, the first coil L1 is between the input-output terminal P1 and the input-output terminal P3, while the second coil L2 is between the input-output terminal P2 and the input-output terminal P4. An ESD protection device Dg1 is provided in a preceding stage of the first coil L1 between the input-output terminal P1 and the input-output terminal P3, and an ESD protection device Dg2 is provided in a preceding stage of the second coil L2 between the input-output terminal P2 and the input-output terminal P4.

As shown in FIG. 3, in the common mode choke coil with a built-in ESD protection device 101, the first coil L1 and the second coil L2 are provided at an upper portion side of the multilayer body 80, while the ESD protection device Dg1 and the ESD protection device Dg2 are provided at a lower portion side of the multilayer body 80. With this configuration, a distance to the ground electrode from a mounting substrate on which the multilayer body 80 is mounted is able to be shortened. Further, because a distance to the ground electrode from the first and second loop conductors, the mounting substrate, and the like becomes long, stray capacitance generated therebetween is able to be reduced. Note that, however, the ESD protection device Dg1 and the ESD protection device Dg2 are not limited to being provided at the lower portion side of the multilayer body 80, and may be provided at the upper portion side of the multilayer body 80.

Figure 5:
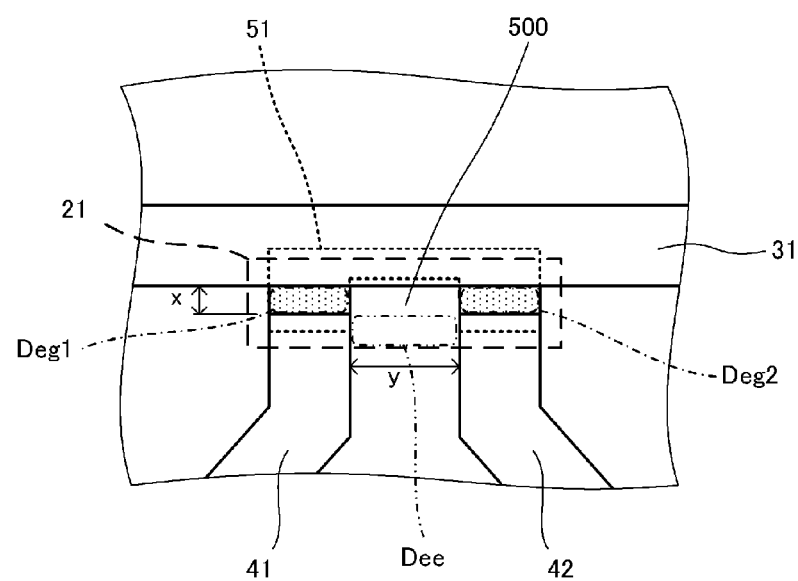
FIG. 5 is a perspective plan view illustrating an ESD protection device in an enlarged manner.

FIG. 5 is a perspective plan view illustrating an ESD protection device in an enlarged manner. The ESD protection device Dg1 includes the hollow portion 21, the first discharge electrode exposed at the hollow portion 21, the ground electrode 31 exposed at the hollow portion 21, and the auxiliary discharge electrode 51. The ESD protection device Dg2 includes the hollow portion 21, the second discharge electrode 42 exposed at the hollow portion 21, the ground electrode 31 exposed at the hollow portion 21, and the auxiliary discharge electrode 51. The ESD protection device Dg1 and the ESD protection device Dg2 are provided in the shared hollow portion 21 using the common ground electrode 31.

With this configuration, because a plurality of ESD protection devices are provided in the single hollow portion 21 that is formed inside the multilayer body 80, miniaturization is able to be realized in comparison with the conventional structure in which the ESD protection devices are separately formed in each hollow portion.

In the present preferred embodiment, the first discharge electrode 41 and the second discharge electrode 42 that are provided in the base material layer 10i are disposed adjacent to each other in the hollow portion 21, and the ground electrode 31 overlaps with the auxiliary discharge electrode 51 preferably having a square or substantially square shape with one side open ("c" shape). Accordingly, as shown in FIG. 5, the auxiliary discharge electrode 51 is located, when viewed in the lamination direction of the base material layers, in a first discharge electrode-ground electrode opposing region Deg1 (corresponding to an "opposing region between a first discharge electrode and a ground electrode") and a second discharge electrode-ground electrode opposing region Deg2 (corresponding to an "opposing region between a second discharge electrode and the ground electrode").

With this configuration, in the present preferred embodiment, the auxiliary discharge electrode 51 is provided at least in the first discharge electrode-ground electrode opposing region Deg1 and the second discharge electrode-ground electrode opposing region Deg2 when viewed in the lamination direction of the base material layers. Because of this, static electricity having entered a transmission line is likely to be discharged in the first discharge electrode-ground electrode opposing region Deg1 and the second discharge electrode-ground electrode opposing region Deg2.

Further, the first discharge electrode 41, the second discharge electrode 42, and the ground electrode 31 in the base material layer 10i overlap with the auxiliary discharge electrode 51 preferably having a square or substantially square shape with one side open ("c" shape) in the hollow portion 21. As such, as shown in FIG. 5, the auxiliary discharge electrode 51 of the common mode choke coil with a built-in ESD protection device 101 includes a non-formation section 500 where the auxiliary discharge electrode 51 is not provided in the hollow portion 21, when viewed in the lamination direction of the base material layers. With this non-formation section 500, the auxiliary discharge electrode 51 is divided into portions on the first discharge electrode 41 side and the second discharge electrode 42 side. Because the auxiliary discharge electrode 51 is not present between the first discharge electrode 41 and the second discharge electrode 42 due to the non-formation section 500, the discharge among the plurality of discharge electrodes disposed adjacent to each other in the hollow portion 21 is significantly reduced or prevented. Accordingly, static electricity having entered one transmission line is prevented from moving to another transmission line, thus making it possible to prevent damage, malfunctions, and so on of the electronic apparatus.

Furthermore, as shown in FIG. 5, in the ESD protection device of the present preferred embodiment, a distance "x" of the first discharge electrode-ground electrode opposing region Deg1 and the second discharge electrode-ground electrode opposing region Deg2 ("x" corresponds to a "clearance of the opposing region between the first discharge electrode and the ground electrode as well as a clearance of the opposing region between the second discharge electrode and the ground electrode") is shorter, when viewed in the lamination direction of the base material layers, than a distance "y" of a first discharge electrode-second discharge electrode adjacent region Dee ("y" corresponds to a "distance of an adjacent region between the first discharge electrode and the second discharge electrode").

With this configuration, static electricity having entered a transmission line is likely to be discharged in the first discharge electrode-ground electrode opposing region Deg1 and the second discharge electrode-ground electrode opposing region Deg2. This makes it possible to significantly reduce or prevent the discharge among the plurality of discharge electrodes disposed adjacent to each other in the hollow portion 21.

As shown in FIG. 3, the auxiliary discharge electrode 51 is provided with conductive particles 300 dispersed in the base material layer of the multilayer body 80, is exposed at the hollow portion 21, and extends along the inner surface of the hollow portion 21. The conductive particles 300 are metal particles of Cu, for example. As shown in FIG. 5, the auxiliary discharge electrode 51 of the present preferred embodiment makes contact with the ground electrode 31, the first discharge electrode 41, and the second discharge electrode 42, and is provided in the first discharge electrode-ground electrode opposing region Deg1 and the second discharge electrode-ground electrode opposing region Deg2. This makes it possible for the ESD protection devices Dg1 and Dg2 to lower the discharge start voltage and improve response characteristics against ESD.

The discharge in the first discharge electrode-ground electrode opposing region Deg1 and the discharge in the second discharge electrode-ground electrode opposing region Deg2 include (1) creeping discharge along the auxiliary discharge electrode 51, (2) aerial discharge in the first discharge electrode-ground electrode opposing region Deg1 and the second discharge electrode-ground electrode opposing region Deg2, and (3) discharge that propagates, like a movement for stepping stones, on the conductive particles 300 having been dispersed in the auxiliary discharge electrode 51. Static electricity is discharged through these types of discharge.

The ESD protection device may preferably be manufactured, according to the example processes and materials explained below.

An electrode paste for forming the first discharge electrode 41 and the second discharge electrode 42 is obtained by adding a solvent to a binder resin formed of Cu powder, ethyl cellulose, and so on, and thereafter carrying out the agitation and mixing.

A resin paste as a starting point of forming the hollow portion 21 is also manufactured by the same method. This resin paste is only formed of a resin and a solvent. As a resin material, such a resin is used that decomposes and evaporates during the calcination. That is, for example, polyethylene terephthalate, polypropylene, acryl resin, or the like is used.

A mixed paste for forming the auxiliary discharge electrode 51 is obtained by blending Cu powder as a conductive material with BAS powder as a ceramic material at a predetermined ratio, adding a binder resin and a solvent thereto, and thereafter carrying out the agitation and mixing.

The lamination of the base material layers is carried out in the manner as follows. That is, like in the case of a typical ceramic multilayer board, ceramic green sheets are laminated and bonded through pressure bonding.

The pressure-bonded multilayer body is cut by a micro cutter and isolated into individual element bodies like in the case of a chip type electronic component such as an LC filter. Thereafter, an electrode paste, which will become various types of outer terminals after the calcination, is applied to end faces of each element body.

Next, like in the case of a typical ceramic multilayer board, calcination is carried out under a nitrogen ($N_2$) atmosphere. In the case where a rare gas such as Ar, Ne, or the like is introduced into the hollow portion in order to lower a response voltage to ESD, the calcination may be carried out under the rare gas atmosphere such as Ar, Ne, or the like in a temperature region in which contraction and sintering of the ceramic material is performed. In the case where the first discharge electrode 41, the second discharge electrode 42, and the outer electrodes (the input-output terminals, the ground electrode, and the like) are made of an electrode material which will not be oxidized, the calcination may be carried out under the air atmosphere.

Thereafter, like in the case of a chip type electronic component such as an LC filter, a Ni—Sn plating film is formed on a surface of each outer electrode by electrolytic Ni—Sn plating.

Note that, in general, it is extremely difficult to carry out calcination in a state in which Fe contained in ferrite is oxidized whereas Cu serving as an electrode material is not oxidized. Therefore, in the case where ferrite is used for the multilayer body, it is necessary to use Ag for the electrode material. However, in the case where the first discharge electrode and the second discharge electrode 42 are formed with Ag, electrochemical migration occurs and a discharge voltage is changed over time in some case. On the other hand, in the case where ferrite is not used for the multilayer body, when the first discharge electrode 41 and the second discharge electrode 42 are formed with Cu, an oxide film of Cu is formed on the electrode surface due to the energy of discharge. However, because this film does not act as a discharge electrode material, the discharge voltage is maintained to be constant or substantially constant even if the discharge is repeated.

In the present preferred embodiment, although metal particles of Cu preferably are dispersed as the conductive particles 300 to form the auxiliary discharge electrode 51, the present invention is not limited thereto. It is preferable for the conductive particles 300 to be at least one type of metal (conductive material) particles, other than the metal particles of Cu, selected from a transition metal group of Ni, Co, Ag, Pd, Rh, Ru, Au, Pt, Ir, and so on, for example. Further, these metals may be each used as a single metal material, but it is also possible to use them in the form of alloy. Moreover, oxides of these metals (resistive material) may be used. Alternatively, a semiconductor material such as SiC may be used as conductive particles to constitute the auxiliary discharge electrode. A mixture of metal particles and semiconductor particles may be used.

By covering a surface of the auxiliary discharge electrode 51 with an inorganic material such as $Al_2O_3$, $ZrO_2$, $SiO_2$, or the like, a mixed calcination material like BAS, or an insulation material such as glass with a high melting point or the like, auxiliary electrode particles are formed. The insulation material covering the surface of the auxiliary discharge electrode 51 is a material that prevents the auxiliary discharge electrode 51 from being sintered, and an insulation material other than the above-cited materials can be used as long as it has an insulative property.

Figure 6:
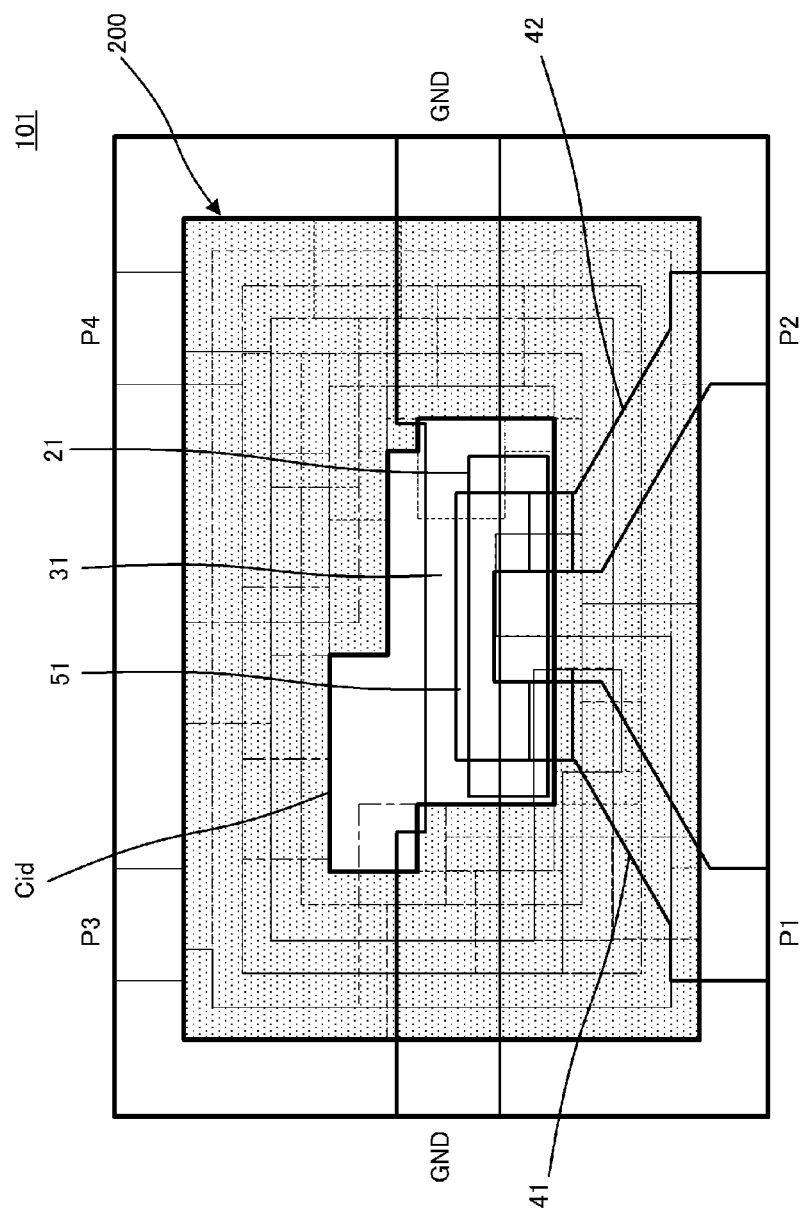
FIG. 6 is a perspective plan view of the common mode choke coil with a built-in ESD protection device 101.

FIG. 6 is a perspective plan view of the common mode choke coil with a built-in ESD protection device 101. In FIG. 6, a loop conductor formation section 200 indicates a formation region of the first loop conductors L1a through L1g and the second loop conductors L2a through L2g that are formed in the base material layers 10b through 10h as shown in FIG. 2, when the common mode choke coil with a built-in ESD protection device 101 is viewed in the lamination direction of the base material layers. A coil opening inner side portion Cid (corresponds to an "inner side of a coil cavity") is a region at an inner side of the loop conductor formation section 200, which preferably has a doughnut shape and in which the loop conductors are not provided, when viewed in the lamination direction of the base material layers.

As described above, the first coil L1 includes the first loop conductors L1a through L1g and the via conductors connecting the first loop conductors, and the second coil L2 includes the second loop conductors L2a through L2g and the via conductors connecting the second loop conductors. Accordingly, the coil opening inner side portion Cid is a cavity of the first coil L1 and the second coil L2. Further, in the common mode choke coil with a built-in ESD protection device 101, the winding axis of each of the first coil L1 and the second coil L2 matches the lamination direction of the base material layers.

As shown in FIG. 6, the hollow portion 21 is provided in the coil opening inner side portion Cid. Since the ESD protection device is provided in the hollow portion 21, it can be also said that the ESD protection device is provided in the coil opening inner side portion Cid. In this manner, the common mode choke coil with a built-in ESD protection device 101 has a structure such that the ESD protection device is located in the coil opening inner side portion Cid of the first coil L1 and the second coil L2, in planar view in the winding axis direction of the first coil L1 and the second coil L2.

With this configuration, in comparison with a case in which no electrode pattern is present in the coil opening inner side portion Cid, it is possible to prevent the generation of a recess in an inner side portion of the first coil L1 and the second coil L2 with a loop shape produced when the calcination of the multilayer body is carried out. With this, the lamination-type common mode choke coil with a built-in ESD protection device having a high level of flatness on the top surface and the bottom surface is able to be realized. Further, since the ground electrode 31, the first discharge electrode 41, the second discharge electrode 42, and the auxiliary discharge electrode 51 are provided in the coil opening inner side portion Cid, it is possible to significantly reduce or prevent the generation of unnecessary stray capacitance between the first loop conductors L1a through L1g of the first coil L1 and the second loop conductors L2a through L2g of the second coil L2. Furthermore, since a distance between the discharge gap of the ESD protection device and the loop conductors of the coils is long, the loop conductors are unlikely to receive the influence of electromagnetic induction, heat, and the like due to the ESD.

Second Preferred Embodiment

Figure 7:
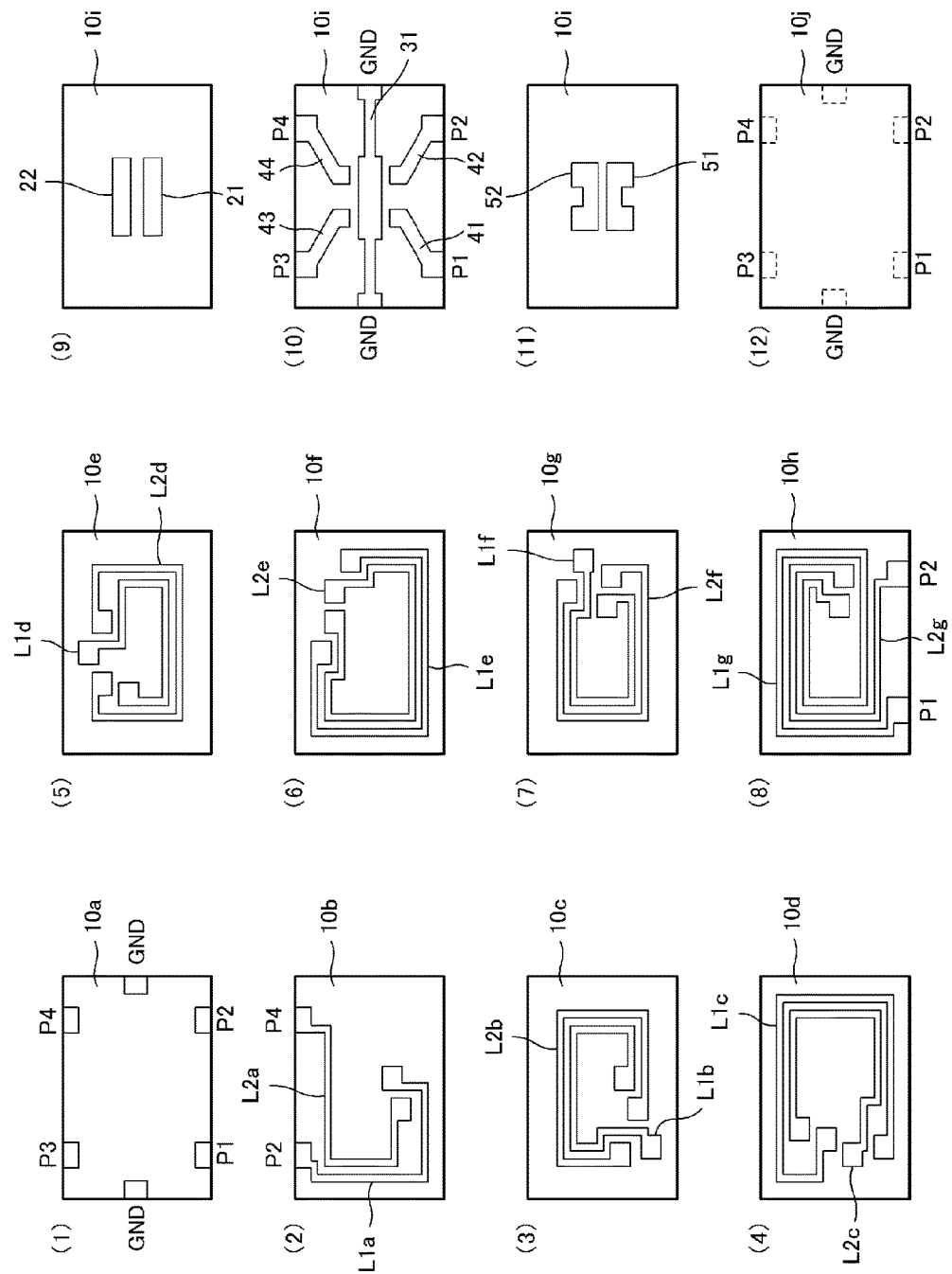
FIG. 7 includes exploded plan views illustrating an electrode pattern and the like of each base material layer of a common mode choke coil with a built-in ESD protection device 102 according to a second preferred embodiment of the present invention.
Figure 8:
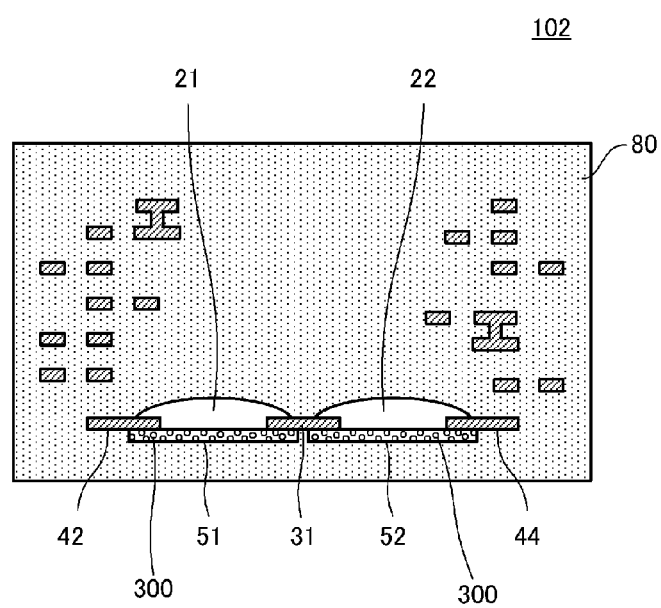
FIG. 8 is a cross-sectional view of the common mode choke coil with a built-in ESD protection device 102 according to the second preferred embodiment of the present invention.
Figure 9:
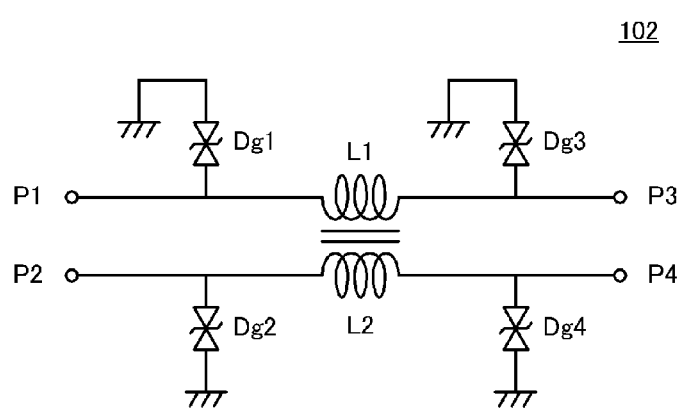
FIG. 9 is a circuit diagram of the common mode choke coil with a built-in ESD protection device 102 according to the second preferred embodiment of the present invention.

With reference to the drawings, a common mode choke coil with a built-in ESD protection device according to a second preferred embodiment of the present invention will be described. FIG. 7 includes exploded plan views illustrating an electrode pattern and the like of each base material layer of a common mode choke coil with a built-in ESD protection device 102 according to the second preferred embodiment. FIG. 8 is a cross-sectional view of the common mode choke coil with a built-in ESD protection device 102 according to the second preferred embodiment. FIG. 9 is a circuit diagram of the common mode choke coil with a built-in ESD protection device 102 according to the second preferred embodiment.

As shown in FIG. 9, the common mode choke coil with a built-in ESD protection device 102 according to the second preferred embodiment differs from the common mode choke coil with a built-in ESD protection device 101 according to the first preferred embodiment in that an ESD protection device Dg3 is provided in a subsequent stage of the first coil L1 and an ESD protection device Dg4 is provided in a subsequent stage of the second coil L2. Other constituent elements preferably are the same as those of the common mode choke coil with a built-in ESD protection device 101.

Hereinafter, only different portions from those of the common mode choke coil with a built-in ESD protection device 101 according to the first preferred embodiment will be discussed.

In FIG. 7, (9) through (11) indicate the configuration of the base material layer 10i. In the base material layer 10i, the auxiliary discharge electrode 51 and an auxiliary discharge electrode 52 are near the center of the base material layer. The auxiliary discharge electrode 52 preferably has a square or substantially square shape with one side open ("c" shape).

Further, in the base material layer 10i, in addition to the ground electrode 31, the first discharge electrode 41, and the second discharge electrode 42, a third discharge electrode 43 and a fourth discharge electrode 44 are provided. The ground electrode 31 preferably has the same configuration as that of the common mode choke coil with a built-in ESD protection device 101. The ground electrode 31 includes a portion exposed at the hollow portion 21 and a portion exposed at a hollow portion 22.

As shown in FIG. 7(10), in a state where the base material layers 10a through 10j are laminated, a portion of the ground electrode 31 of the present preferred embodiment that overlaps with the first loop conductors L1a through L1g and the second loop conductors L2a through L2g has a thinner line width than a portion thereof that exposes in the hollow portions 21 and 22 (a center portion of the ground electrode 31 in FIG. 7(10)). In other words, the line width of a portion of the ground electrode 31 that overlaps with the first coil L1 and the second coil L2 is thinner, when viewed in the lamination direction of the base material layers, than the line width of a portion thereof that exposes in the hollow portions 21 and 22. Meanwhile, the center portion of the ground electrode 31, which opposes the first discharge electrode 41, the second discharge electrode 42, the third discharge electrode 43, and the fourth discharge electrode 44 in the hollow portions 21 and 22, has a wider line width than a portion thereof that overlaps with the first coil L1 and the second coil L2, when viewed in the lamination direction of the base material layers.

The first discharge electrode 41 and the second discharge electrode 42 have the same configurations as those of the common mode choke coil with a built-in ESD protection device 101. The third discharge electrode 43 extends from one long side of the base material layer (a long side on the upper side in FIG. 7) toward the vicinity of the center of the base material layer. One end of the third discharge electrode 43 is connected to the input-output terminal P3, and the other end of the third discharge electrode 43 is exposed at the hollow portion 22 and includes a portion that comes close to and opposes the ground electrode 31 near the center of the base material layer. The fourth discharge electrode 44 extends from the one long side of the base material layer (the long side on the upper side in FIG. 7) toward the vicinity of the center of the base material layer. One end of the fourth discharge electrode 44 is connected to the input-output terminal P4, and the other end of the fourth discharge electrode 44 is exposed at the hollow portion 22 and includes a portion that comes close to and opposes the ground electrode 31 near the center of the base material layer.

Further, in the base material layer 10i, the rectangular or substantially rectangular hollow portion 21 and the rectangular or substantially rectangular hollow portion 22 are near the center of the base material layer.

The hollow portion 22, the third discharge electrode 43 exposed at the hollow portion 22, the ground electrode 31 exposed at the hollow portion 22, and the auxiliary discharge electrode 52 define the ESD protection device Dg3. Meanwhile, the hollow portion 22, the fourth discharge electrode 44 exposed at the hollow portion 22, the ground electrode 31 exposed at the hollow portion 22, and the auxiliary discharge electrode 52 constitute the ESD protection device Dg4. The ESD protection device Dg3 and the ESD protection device Dg4 are provided in the shared hollow portion 22 using the common ground electrode 31.

In the present preferred embodiment, the third discharge electrode 43 and fourth discharge electrode 44 are upper-lower symmetric with the first discharge electrode and second discharge electrode with respect to a short-side direction of the base material layer. The common mode choke coil with a built-in ESD protection device 102 has a structure such that the ESD protection device Dg1 and ESD protection device Dg2 are upper-lower symmetric with the ESD protection device Dg3 and ESD protection device Dg4 with respect to the short-side direction of the base material layer.

With the above configuration, the common mode choke coil with a built-in ESD protection device 102 including the ESD protection device Dg1, ESD protection device Dg2, ESD protection device Dg3, and ESD protection device Dg4 is provided.

As discussed above, in the present preferred embodiment, the line width of a portion of the ground electrode 31 that overlaps with the first coil L1 and the second coil L2 is thinner, when viewed in the lamination direction of the base material layers, than the line width of a portion thereof that exposes in the hollow portions 21 and 22 (the center portion of the ground electrode 31 in FIG. 7(10)). With this configuration, an opposing area between the ground electrode 31 and the conductors of the first coil L1 and second coil L2 (the first loop conductors L1a through L1g and the second loop conductors L2a through L2g) is able to be made small. This makes it possible to significantly reduce stray capacitance generated between the ground electrode 31 and the conductors of the first coil L1 and the second coil L2.

Further, as discussed above, the center portion of the ground electrode 31, which opposes the first discharge electrode 41, the second discharge electrode 42, the third discharge electrode 43, and the fourth discharge electrode 44 in the hollow portions 21 and 22, has a wider line width than a portion thereof that overlaps with the first coil L1 and the second coil L2, when viewed in the lamination direction of the base material layers. With this configuration, the clearance (see "x" in FIG. 5) of an opposing region between the ground electrode 31 and the discharge electrodes (the first discharge electrode 41, second discharge electrode 42, third discharge electrode 43, and fourth discharge electrode 44) is able to be made shorter than the distance between the discharge electrodes disposed adjacent to each other in the hollow portion (see "y" in FIG. 5) (that is, x<y). As such, static electricity having entered a transmission line is likely to be discharged between the discharge electrodes and the ground electrode, thus significantly reducing the discharge among the plurality of discharge electrodes disposed adjacent to each other in the hollow portion.

Third Preferred Embodiment

Figure 10:
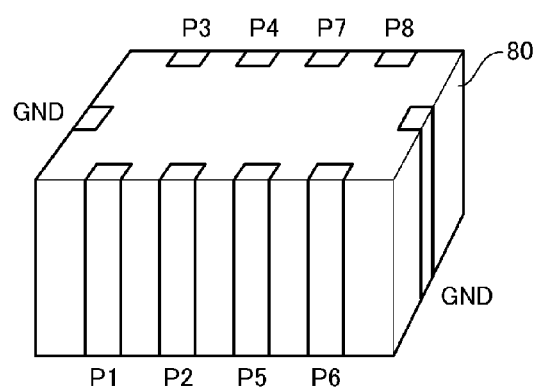
FIG. 10 is a perspective view of exterior appearance of a common mode choke coil with a built-in ESD protection device 103 according to a third preferred embodiment of the present invention.
Figure 11:
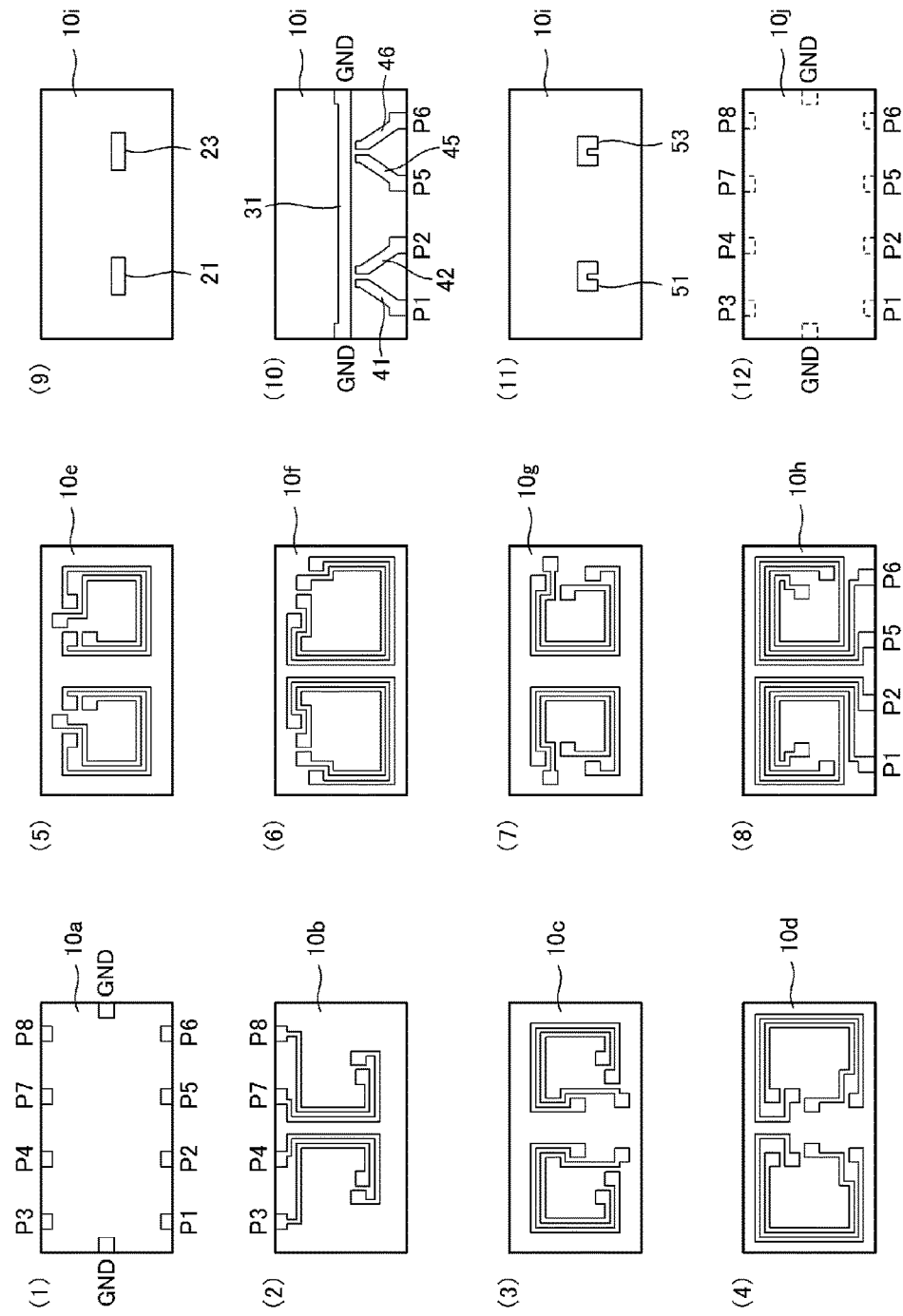
FIG. 11 includes exploded plan views illustrating an electrode pattern and the like of each base material layer of the common mode choke coil with a built-in ESD protection device 103 according to the third preferred embodiment of the present invention.
Figure 12:
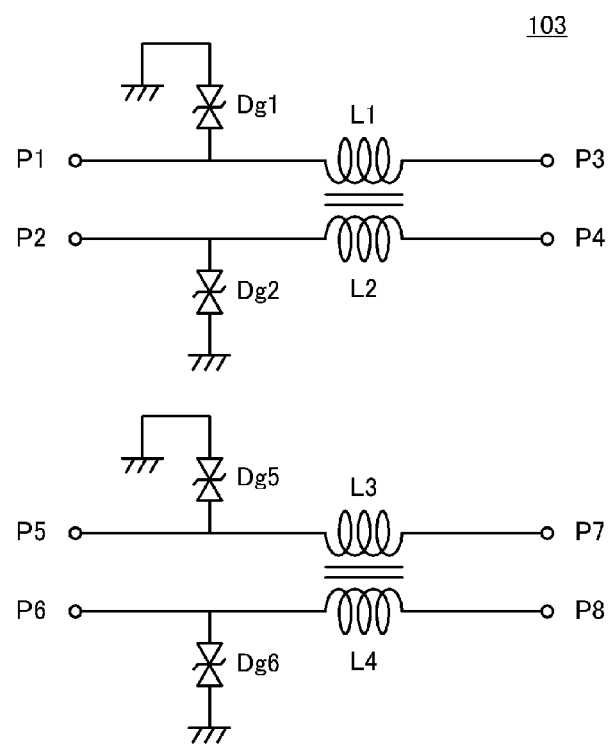
FIG. 12 is a circuit diagram of the common mode choke coil with a built-in ESD protection device 103 according to the third preferred embodiment of the present invention.

A common mode choke coil with a built-in ESD protection device according to a third preferred embodiment of the present invention will be described with reference to the drawings. FIG. 10 is a perspective view of exterior appearance of a common mode choke coil with a built-in ESD protection device 103 according to the third preferred embodiment. FIG. 11 includes exploded plan views illustrating an electrode pattern and the like of each base material layer of the common mode choke coil with a built-in ESD protection device 103 according to the third preferred embodiment. FIG. 12 is a circuit diagram of the common mode choke coil with a built-in ESD protection device 103 according to the third preferred embodiment.

The common mode choke coil with a built-in ESD protection device 103 according to the third preferred embodiment differs from the common mode choke coil with a built-in ESD protection device 101 according to the first preferred embodiment in that an input-output terminal P5, an input-output terminal P6, an input-output terminal P7, and an input-output terminal P8 are further included therein. In other words, the common mode choke coil with a built-in ESD protection device 103 has a structure such that two circuits each of which defines the common mode choke coil with a built-in ESD protection device described in the first preferred embodiment are provided and aligned in the long-side direction of the base material layer inside the common multilayer body 80; the circuit configurations in each of the two circuits are right-left symmetric. Other constituent elements are preferably the same as those of the common mode choke coil with a built-in ESD protection device 101.

As shown in FIG. 10, the multilayer body 80 of the present preferred embodiment includes, on its outer surface, the input-output terminal P1, the input-output terminal P2, the input-output terminal P3, the input-output terminal P4, the input-output terminal P5, the input-output terminal P6, the input-output terminal P7, the input-output terminal P8, and the ground terminals GND.

As discussed above, the common mode choke coil with a built-in ESD protection device 103 has a structure such that the two circuits each of which configures the common mode choke coil with a built-in ESD protection device described in the first preferred embodiment are provided and aligned in the long-side direction of the base material layer inside the common multilayer body 80; the circuit configurations in each of the two circuits are right-left symmetric. Accordingly, as shown in FIG. 12, the first coil L1 is provided between the input-output terminal P1 and the input-output terminal P3, and the second coil L2 is provided between the input-output terminal P2 and the input-output terminal P4. The ESD protection device Dg1 is provided between the input-output terminal P1 and the input-output terminal P3, in a preceding stage of the first coil L1, while the ESD protection device Dg2 is provided between the input-output terminal P2 and the input-output terminal P4, in a preceding stage of the first coil L2. A third coil L3 is provided between the input-output terminal P5 and the input-output terminal P7, and a fourth coil L4 is provided between the input-output terminal P6 and the input-output terminal P8. An ESD protection device Dg5 is provided between the input-output terminal P5 and the input-output terminal P7, in a preceding stage of the third coil L3, while an ESD protection device Dg6 is provided between the input-output terminal P6 and the input-output terminal P8, in a preceding stage of the fourth coil L4.

The third coil L3 and the fourth coil L4 are coupled in a direction to block a common mode current, so as to define and function as a common mode choke coil.

With the structure as discussed above, the common mode choke coil with a built-in ESD protection device 103, including the first coil L1 and second coil L2 coupled to each other, the third coil L3 and fourth coil L4 also coupled to each other, and the ESD protection devices inside the multilayer body 80, is provided.

Fourth Preferred Embodiment

Figure 13:
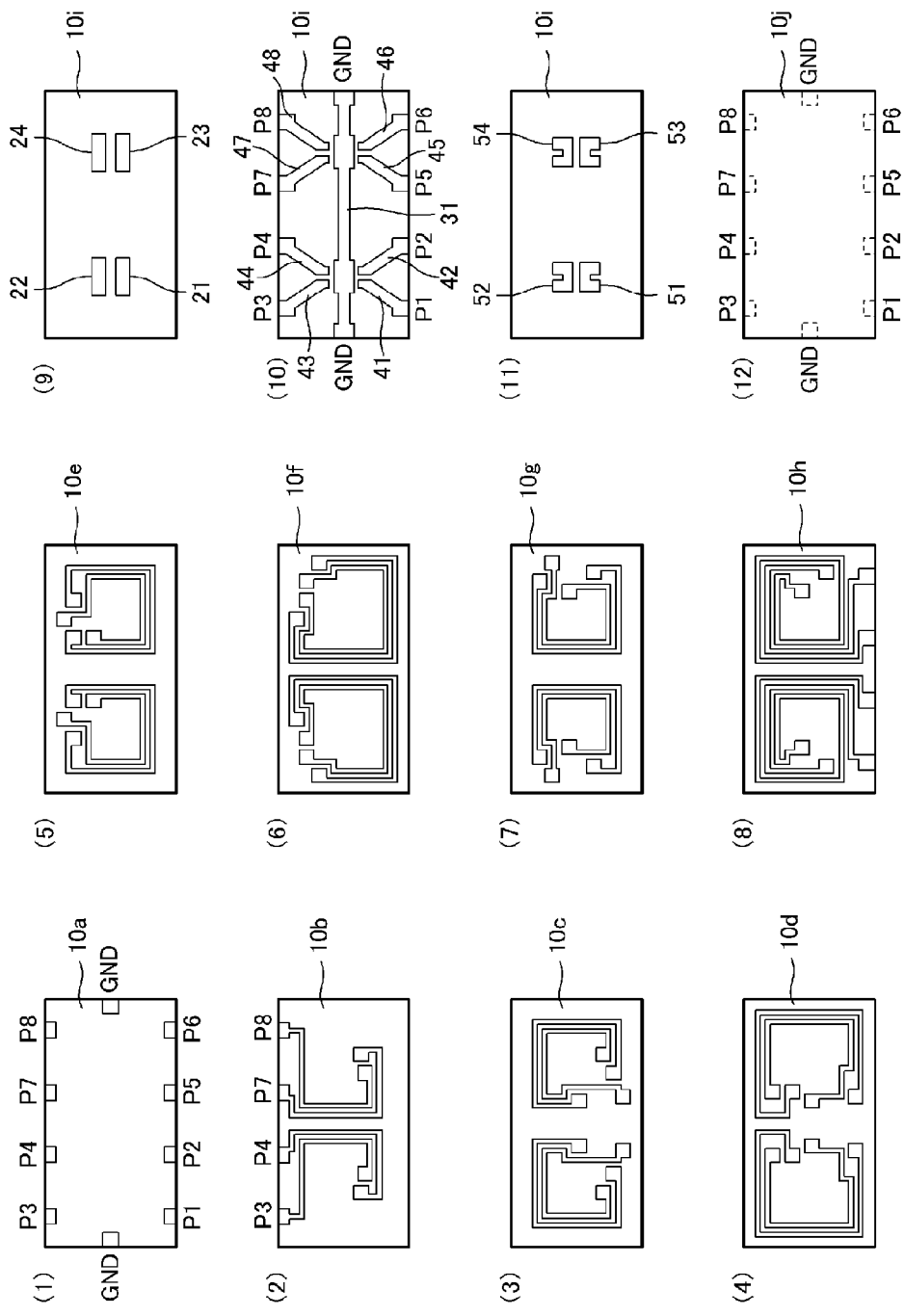
FIG. 13 includes exploded plan views illustrating an electrode pattern and the like of each base material layer of a common mode choke coil with a built-in ESD protection device 104 according to a fourth preferred embodiment of the present invention.
Figure 14:
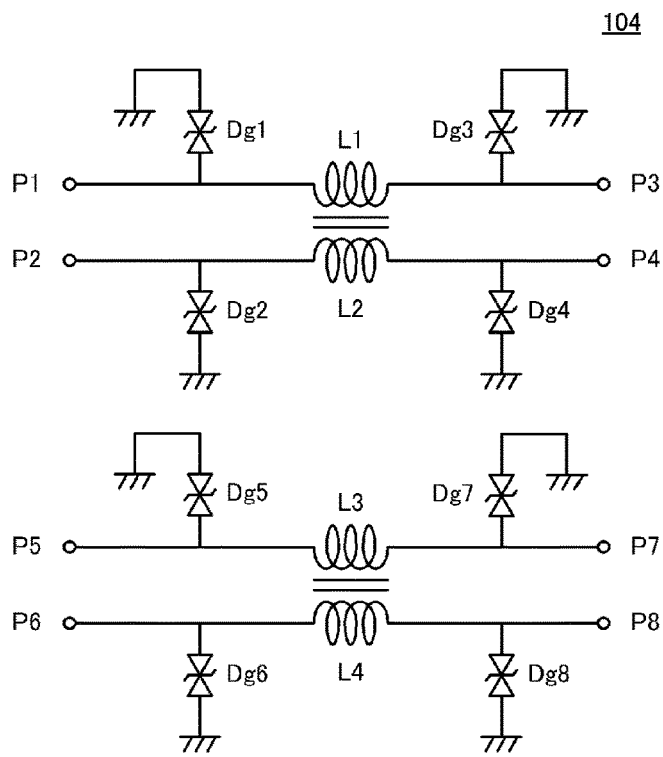
FIG. 14 is a circuit diagram of the common mode choke coil with a built-in ESD protection device 104 according to the fourth preferred embodiment of the present invention.

A common mode choke coil with a built-in ESD protection device according to a fourth preferred embodiment of the present invention will be described with reference to the drawings. FIG. 13 includes exploded plan views illustrating an electrode pattern and the like of each base material layer of a common mode choke coil with a built-in ESD protection device 104 according to the fourth preferred embodiment. FIG. 14 is a circuit diagram of the common mode choke coil with a built-in ESD protection device 104 according to the fourth preferred embodiment.

The common mode choke coil with a built-in ESD protection device 104 according to the fourth preferred embodiment differs from the common mode choke coil with a built-in ESD protection device 103 according to the third preferred embodiment in that the ESD protection device Dg3 is provided in a subsequent stage of the first coil L1, the ESD protection device Dg4 is provided in a subsequent stage of the second coil L2, the ESD protection device Dg7 is provided in a subsequent stage of the third coil L3, and an ESD protection device Dg8 is provided in a subsequent stage of the fourth coil L4. Other constituent elements are the same as those of the common mode choke coil with a built-in ESD protection device 103. In other words, the common mode choke coil with a built-in ESD protection device 104 has a structure such that two circuits each of which defines the common mode choke coil with a built-in ESD protection device described in the second preferred embodiment are provided and aligned in the long-side direction of the base material layer inside the common multilayer body 80; the circuit configurations in each of the two circuits are right-left symmetric.

Hereinafter, only different portions from those of the common mode choke coil with a built-in ESD protection device 103 according to the third preferred embodiment will be discussed.

In FIG. 13, (9) through (11) indicate the configuration of the base material layer 10$i$. In the base material layer 10$i$, the auxiliary discharge electrodes 51, 52 and the auxiliary discharge electrodes 53, 54 are right-left symmetric with respect to the long-side direction of the base material layer. The auxiliary discharge electrode 51 and the auxiliary discharge electrode 53 preferably have the same configurations as those of the common mode choke coil with a built-in ESD protection device 103 according to the third preferred embodiment. The auxiliary discharge electrode 52 preferably has a square or substantially square shape with one side open ("c" shape), and the auxiliary discharge electrode 54 also preferably has a square or substantially square shape with one side open ("c" shape), Further, in the base material layer 10$i$, the ground electrode 31, the first discharge electrode 41, the second discharge electrode 42, the third discharge electrode 43, the fourth discharge electrode 44, a fifth discharge electrode 45, a sixth discharge electrode 46, a seventh discharge electrode 47, and an eighth discharge electrode 48 are provided. The configuration of the ground electrode 31 preferably is the same as that of the common mode choke coil with a built-in ESD protection device 103. The ground electrode 31 includes a portion exposed at the hollow portion 21, a portion exposed at the hollow portion 22, a portion exposed at a hollow portion 23, and a portion exposed at a hollow portion 24.

Like in the second preferred embodiment, in a state where the base material layers 10$a$ through 10$j$ are laminated, a portion of the ground electrode 31 of the present preferred embodiment that overlaps with the loop conductors has a thinner line width than a portion thereof that exposes in the hollow portions 21 through 24 (a laterally-extended center portion of the ground electrode 31 in FIG. 13(10)). In other words, the line width of a portion of the ground electrode 31 that overlaps with the first coil L1, second coil L2, third coil L3, and fourth coil L4 is thinner, when viewed in the lamination direction of the base material layers, than the line width of a portion thereof that exposes in the hollow portions 21 through 24. Meanwhile, a portion of the ground electrode 31 that opposes the first discharge electrode 41, second discharge electrode 42, third discharge electrode 43, fourth discharge electrode 44, fifth discharge electrode 45, sixth discharge electrode 46, seventh discharge electrode 47, and eighth discharge electrode 48 in the hollow portions 21 through 24, has a wider line width than the portion thereof that overlaps with the first coil L1, second coil L2, third coil L3, and fourth coil L4, when viewed in the lamination direction of the base material layers.

The first discharge electrode 41, the second discharge electrode 42, the fifth discharge electrode 45, and the sixth discharge electrode 46 preferably have the same configurations as those of the common mode choke coil with a built-in ESD protection device 103. The third discharge electrode 43 extends from one long side of the base material layer (a long side on the upper side in FIG. 13) toward the vicinity of the center of the base material layer. One end of the third discharge electrode 43 is connected to the input-output terminal P3, and the other end of the third discharge electrode 43 is exposed at the hollow portion and includes a portion that comes close to and opposes the ground electrode 31 near the center of the base material layer. The fourth discharge electrode 44 extends from the one long side of the base material layer (the long side on the upper side in FIG. 13) toward the vicinity of the center of the base material layer. One end of the fourth first discharge electrode 44 is connected to the input-output terminal P4, and the other end of the fourth discharge electrode 44 is exposed at the hollow portion 22 and includes a portion that comes close to and opposes the ground electrode 31 near the center of the base material layer. The seventh discharge electrode 47 extends from the one long side of the base material layer (the long side on the upper side in FIG. 13) toward the vicinity of the center of the base material layer. One end of the seventh discharge electrode 47 is connected to the input-output terminal P7, and the other end of the seventh discharge electrode 47 is exposed at the hollow portion 24 and includes a portion that comes close to and opposes the ground electrode 31 near the center of the base material layer. The eighth discharge electrode 48 extends from the one long side of the base material layer (the long side on the upper side in FIG. 13) toward the vicinity of the center of the base material layer. One end of the eighth discharge electrode 48 is connected to the input-output terminal P8, and the other end of the eighth discharge electrode 48 is exposed at the hollow portion 24 and includes a portion that comes close to and opposes the ground electrode 31 near the center of the base material layer.

Further, in the base material layer 10i, there are provided the rectangular or substantially rectangular hollow portion 21, the rectangular or substantially rectangular hollow portion 22, the rectangular or substantially rectangular hollow portion 23, and the rectangular or substantially rectangular hollow portion 24.

The hollow portion 22, the third discharge electrode 43 exposed at the hollow portion 22, the ground electrode 31 exposed at the hollow portion 22, and the auxiliary discharge electrode 52 define the ESD protection device Dg3. Meanwhile, the hollow portion 22, the fourth discharge electrode 44 exposed at the hollow portion 22, the ground electrode 31 exposed at the hollow portion 22, and the auxiliary discharge electrode 52 define the ESD protection device Dg4. The ESD protection device Dg3 and the ESD protection device Dg4 are provided in the shared hollow portion 22 using the common ground electrode 31.

The hollow portion 24, the seventh discharge electrode exposed at the hollow portion 24, the ground electrode 31 exposed at the hollow portion 24, and the auxiliary discharge electrode 54 define the ESD protection device Dg7. Meanwhile, the hollow portion 24, the eighth discharge electrode 48 exposed at the hollow portion 24, the ground electrode 31 exposed at the hollow portion 24, and the auxiliary discharge electrode 54 define the ESD protection device Dg8. The ESD protection device Dg7 and the ESD protection device Dg8 are provided in the shared hollow portion 24 using the common ground electrode 31.

In the present preferred embodiment, the third and fourth discharge electrodes 43, 44 and the first and second discharge electrodes 41, 42 are upper-lower symmetric with respect to the short-side direction of the base material layer.

The seventh and eighth discharge electrodes 47, 48 and the fifth and sixth discharge electrodes 45, 46 are upper-lower symmetric with respect to the short-side direction of the base material layer. The common mode choke coil with a built-in ESD protection device 104 has a structure such that the ESD protection devices Dg1, Dg2, Dg5, and Dg6 and the ESD protection devices Dg3, Dg4, Dg7, and Dg8 are upper-lower symmetric with respect to the short-side direction of the base material layer.

With the configuration as discussed above, the common mode choke coil with a built-in ESD protection device 104 including the ESD protection device Dg1, ESD protection device Dg2, ESD protection device Dg3, ESD protection device Dg4, ESD protection device Dg5, ESD protection device Dg6, ESD protection device Dg7, and ESD protection device Dg8 is provided.

Fifth Preferred Embodiment

Figure 15:
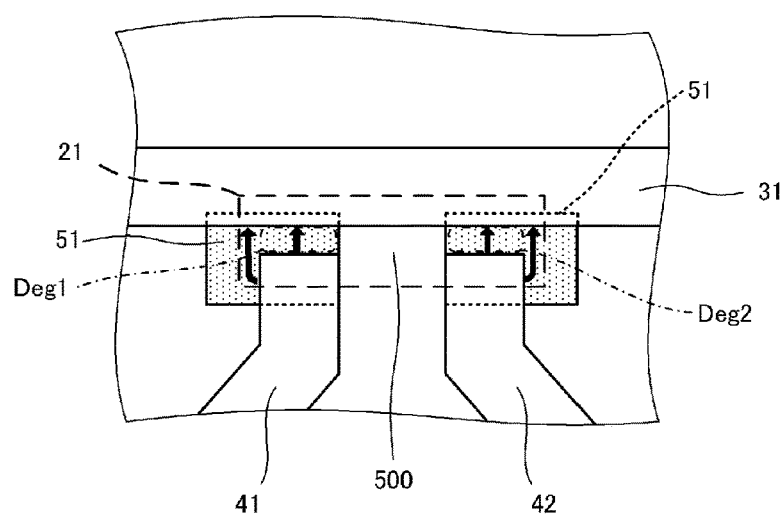
FIG. 15 is a perspective plan view illustrating an ESD protection device according to a fifth preferred embodiment of the present invention.

An ESD protection device according to a fifth preferred embodiment of the present invention will be described with reference to the drawings. FIG. 15 is a perspective plan view illustrating an ESD protection device according to the fifth preferred embodiment.

The ESD protection device according to the fifth preferred embodiment differs from the ESD protection device according to the first preferred embodiment shown in FIG. 5 in that the auxiliary discharge electrode 51 is provided in the hollow portion 21 aside from the first discharge electrode-ground electrode opposing region Deg1 and the second discharge electrode-ground electrode opposing region Deg2. Other constituent elements are preferably the same as those of the ESD protection device according to the first preferred embodiment.

Note that, as shown in FIG. 15, unlike the auxiliary discharge electrodes described in the foregoing preferred embodiments, the auxiliary discharge electrode 51 of the present preferred embodiment preferably does not have a square or substantially square shape with one side open ("c" shape), but is partitioned into two segments in the base material layer. Also in this configuration, as shown in FIG. 15, the ESD protection device according to the fifth preferred embodiment includes the non-formation section 500 where the auxiliary discharge electrode 51 is not provided in the hollow portion 21, when viewed in the lamination direction of the base material layers. With this non-formation section 500, the auxiliary discharge electrode 51 is divided into the portions on the first discharge electrode 41 side and the second discharge electrode 42 side. Further, the auxiliary discharge electrode 51 is provided in the first discharge electrode-ground electrode opposing region Deg1 and the second discharge electrode-ground electrode opposing region Deg2 while making contact with the ground electrode 31, the first discharge electrode 41, and the second discharge electrode 42. In this manner, the shape, the arrangement, the number, and so on of the auxiliary discharge electrodes 51 are able to be appropriately modified within the range satisfying the above-described configuration.

In this configuration, since the auxiliary discharge electrode 51 is provided in a portion aside from the first discharge electrode-ground electrode opposing region Deg1 and the second discharge electrode-ground electrode opposing region Deg2, an area of the auxiliary discharge electrode 51 that makes contact with the ground electrode 31 and the first discharge electrode 41 is larger than that of the ESD protection device according to the first preferred embodiment.

In the case where creeping discharge once occurs along an auxiliary discharge electrode in an ESD protection device, insulation resistance of a path of the above discharge increases. As such, in the case where an area of the auxiliary discharge electrode that makes contact with a ground electrode and a discharge electrode is small, the number of discharge paths for static electricity within the ESD protection device becomes small, such that deterioration in the insulation resistance is likely to occur if discharge of static electricity is repeated. In contrast, because the area of the auxiliary discharge electrode 51 of the present preferred embodiment is large in comparison with the ESD protection device according to the first preferred embodiment, a larger number of discharge paths for static electricity are provided (see arrows in FIG. 15). Accordingly, with this configuration, the deterioration in insulation resistance is unlikely to occur even if the discharge of static electricity repeatedly occurs, thus making it possible to improve the characteristics for the repetition of static electricity discharge in comparison with the ESD protection device according to the first preferred embodiment.

Sixth Preferred Embodiment

Figure 16:
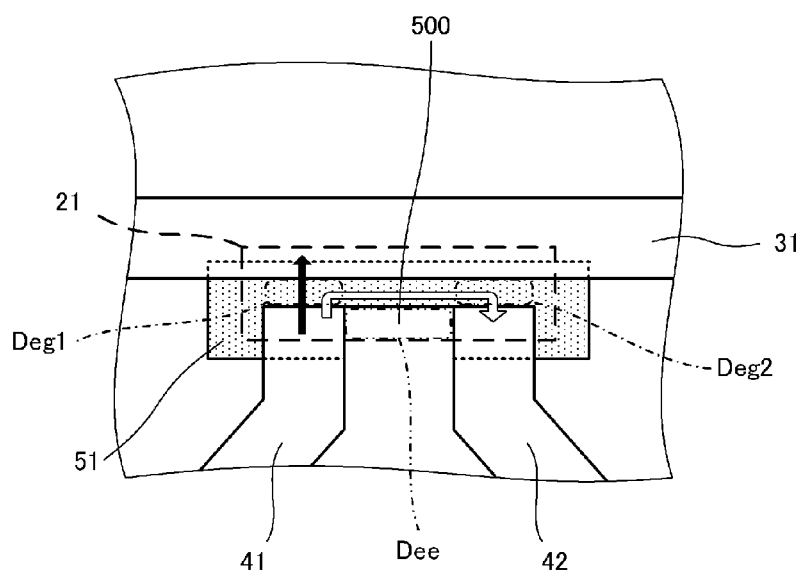
FIG. 16 is a perspective plan view illustrating an ESD protection device according to a sixth preferred embodiment of the present invention.

An ESD protection device according to a sixth preferred embodiment of the present invention will be described with reference to the drawings. FIG. 16 is a perspective plan view illustrating the ESD protection device according to the sixth preferred embodiment.

The ESD protection device according to the sixth preferred embodiment differs from the ESD protection device according to the first preferred embodiment in that the non-formation section 500 of the auxiliary discharge electrode 51 is provided only in the first discharge electrode-second discharge electrode adjacent region Dee. Other constituent elements are preferably the same as those of the ESD protection device according to the first preferred embodiment.

As shown in FIG. 16, the ESD protection device of the present preferred embodiment includes the non-formation section 500, where the auxiliary discharge electrode 51 is not provided, in the first discharge electrode-second discharge electrode adjacent region Dee. Further, the non-formation section 500 divides the auxiliary discharge electrode 51 in the first discharge electrode-second discharge electrode adjacent region Dee into the portions on the first discharge electrode 41 side and the second discharge electrode 42 side.

In this configuration, unlike the ESD protection device according to the first preferred embodiment, the auxiliary discharge electrode 51 makes contact with all of the ground electrode 31, the first discharge electrode 41, and the second discharge electrode 42. However, the auxiliary discharge electrode 51 in the first discharge electrode-second discharge electrode adjacent region Dee is divided into the portions on the first discharge electrode side and the second discharge electrode side by the non-formation section 500. Because of this, in comparison with a creepage distance between the first discharge electrode 41 and the ground electrode 31 or between the second discharge electrode 42 and the ground electrode 31 (see a black arrow in FIG. 16), a creepage distance between the first discharge electrode 41 and the second discharge electrode 42 (see an outlined arrow in FIG. 16) is long. This significantly reduces or prevents the occurrence of creeping discharge between the first discharge electrode 41 and the second discharge electrode 42 in comparison with the creeping discharge between the first discharge electrode 41 and the ground electrode 31 or between the second discharge electrode 42 and the ground electrode 31.

As such, also in the configuration discussed above, discharge among a plurality of discharge electrodes disposed adjacent to each other in a hollow portion is significantly reduced or prevented. In other words, static electricity having entered one transmission line is prevented from moving to another transmission line.

Seventh Preferred Embodiment

Figure 17:
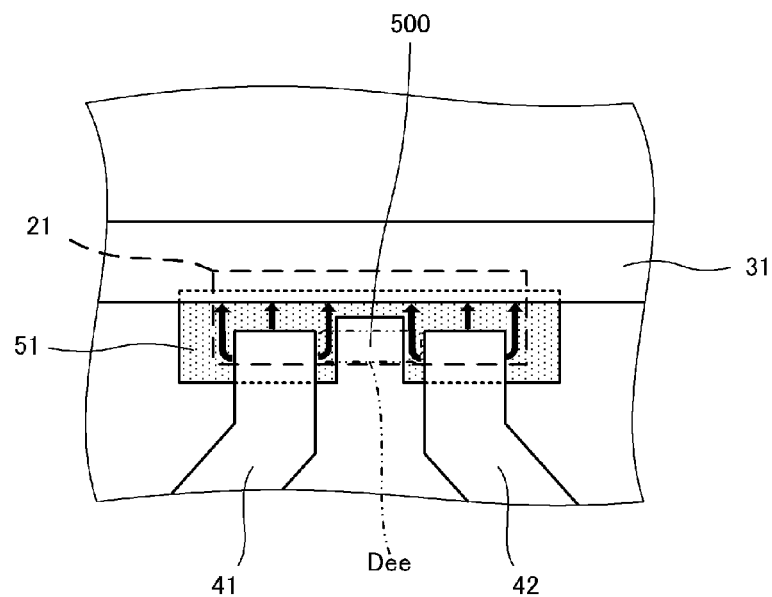
FIG. 17 is a perspective plan view illustrating an ESD protection device according to a seventh preferred embodiment of the present invention.

An ESD protection device according to a seventh preferred embodiment of the present invention will be described with reference to the drawings. FIG. 17 is a perspective plan view illustrating the ESD protection device according to the seventh preferred embodiment.

The ESD protection device according to the seventh preferred embodiment differs from the ESD protection device according to the sixth preferred embodiment in that the auxiliary discharge electrode 51 extends at least beyond outer edges of the portions of the first discharge electrode 41 and the second discharge electrode 42 that are exposed at the hollow portion 21. Other constituent elements are preferably the same as those of the ESD protection device according to the sixth preferred embodiment.

As discussed above, the auxiliary discharge electrode 51 according to the seventh preferred embodiment extends at least beyond the outer edges of the portions of the first discharge electrode 41 and the second discharge electrode 42 that are exposed at the hollow portion 21 when viewed in the lamination direction of the base material layers.

As described above, in the case where the auxiliary discharge electrode 51 extends beyond the outer edges of the first discharge electrode 41 and second discharge electrode 42 that are exposed at the hollow portion 21 when viewed in the lamination direction of the base material layers, a variation in ESD protection characteristics is significantly reduced or prevented even if a lamination shift occurs in the manufacturing. This makes it possible to improve a non-defective product rate through reducing the influence of the lamination shift.

Further, as in the case of the ESD protection device according to the sixth preferred embodiment, an area of the auxiliary discharge electrode 51 in the present preferred embodiment is large in comparison with the ESD protection device according to the first preferred embodiment, so that a larger number of discharge paths for static electricity are provided (see arrows in FIG. 17). As such, with this configuration, the deterioration in insulation resistance is unlikely to occur even if the discharge of static electricity repeatedly occurs, thus making it possible to improve the characteristic for the repetition of static electricity discharge in comparison with the ESD protection device according to the first preferred embodiment.

Note that, unlike the ESD protection device according to the sixth preferred embodiment, the ESD protection device according to a preferred embodiment of the present preferred embodiment includes the non-formation section 500 in a manner in which the stated non-formation section 500 extends across not all the first discharge electrode-second discharge electrode adjacent region Dee, as shown in FIG. 17.

As discussed above, the ESD protection device according to a preferred embodiment of the present preferred embodiment includes the non-formation section 500 at least partially in the first discharge electrode-second discharge electrode adjacent region Dee, when viewed in the lamination direction of the base material layers. Further, the non-formation section 500 divides the auxiliary discharge electrode 51 in the first discharge electrode-second discharge electrode adjacent region Dee into a portion on the first discharge electrode 41 side and a portion on the second discharge electrode 42 side.

Also in this configuration, like in the case of the ESD protection device according to the sixth preferred embodiment, discharge among a plurality of discharge electrodes disposed adjacent to each other in a hollow portion is significantly reduced or prevented. Because of this, static electricity having entered one transmission line is prevented from moving to another transmission line.

Other Preferred Embodiments

In the above preferred embodiments, although metal particles of Cu as conductive particles preferably are dispersed in the auxiliary discharge electrode, the invention is not limited thereto. The auxiliary discharge electrode may be formed with aggregation of a plurality of metal particles having a core shell structure that includes a core portion whose main ingredient is a first metal and a shell portion whose main ingredient is a metal oxide containing a second metal.

In the core shell structure, the shell portion is formed by heating an alloy of the first metal and the second metal and moving the second metal ingredient to a surface of the alloy particle. The first metal forming the alloy is Cu, for example, while the second metal is Al, for example. In each alloy particle that defines an alloy powder, the core portion whose main gradient is the first metal is formed by moving the second metal toward the surface of the alloy particle, and the shell portion whose main ingredient is a metal oxide containing the second metal is formed by oxidizing the second metal at a time when the second metal has reached the surface. By using the method as discussed above, the auxiliary discharge electrode formed with aggregation of a plurality of metal particles having a core shell structure may be provided.

Although examples of the common mode choke coil with a built-in ESD protection device are given in the above preferred embodiments, the present invention is not limited to the common mode choke coil. That is, electric components other than the common mode choke coil may be provided inside the multilayer body 80 so as to be integral with an ESD protection device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection device comprising:
   a multilayer body including a plurality of base material layers;
   a hollow portion inside the multilayer body;
   a ground electrode at least a portion of which is exposed at the hollow portion;
   a first discharge electrode and a second discharge electrode which oppose the ground electrode and include at least a portion exposed at the hollow portion; and
   an auxiliary discharge electrode which includes conductive particles dispersed in the base material layers and at least a portion exposed at the hollow portion, and which is provided along a surface of the hollow portion; wherein
   the first discharge electrode and the second discharge electrode are adjacent to each other in the hollow portion when viewed in a lamination direction of the base material layers;
   the auxiliary discharge electrode is located at least in an opposing region between the first discharge electrode and the ground electrode as well as an opposing region between the second discharge electrode and the ground electrode, and includes a non-formation portion where the auxiliary discharge electrode is not provided in the hollow portion, when viewed in the lamination direction of the base material layers; and
   the non-formation portion divides at least the auxiliary discharge electrode in an adjacent region between the first discharge electrode and the second discharge electrode into a portion on a first discharge electrode side and a portion on a second discharge electrode side.

2. The ESD protection device according to claim 1, wherein a clearance of the opposing region between the first discharge electrode and the ground electrode as well as a clearance of the opposing region between the second discharge electrode and the ground electrode is shorter than a distance of the adjacent region between the first discharge electrode and the second discharge electrode.

3. The ESD protection device according to claim 1, wherein the non-formation portion divides the auxiliary discharge electrode into a portion on the first discharge electrode side and a portion on the second discharge electrode side.

4. The ESD protection device according to claim 1, wherein the auxiliary discharge electrode extends at least beyond outer edges of the first discharge electrode and the second discharge electrode that are exposed at the hollow portion when viewed in the lamination direction of the base material layers.

5. The ESD protection device according to claim 1, wherein the auxiliary discharge electrode has a square or substantially square shape with one open side.

6. The ESD protection device according to claim 1, wherein the ground electrode extends linearly between two shorter sides of one of the base material layers, and the first and second discharge electrodes extend from one longer side of the one of the base material layers to an approximate center of the one of the base material layers.

7. The ESD protection device according to claim 1, wherein the hollow portion is rectangular or substantially rectangular.

8. The ESD protection device according to claim 1, wherein the hollow portion is located at or adjacent to a center of one of the base material layers.

9. The ESD protection device according to claim 1, wherein the base material layers are made of one of a magnetic material and a dielectric material.

10. The ESD protection device according to claim 1, wherein the auxiliary discharge electrode contacts the ground electrode, the first discharge electrode, and the second discharge electrode.

11. The ESD protection device according to claim 1, wherein the auxiliary discharge electrode is divided into two segments.

12. The ESD protection device according to claim 1, wherein the auxiliary discharge electrode extends at least beyond outer edges of portions of the first discharge electrode and the second discharge electrode exposed at the hollow portion.

13. A common mode choke coil with a built-in ESD protection device, comprising:
- a first coil and a second coil coupled to each other; and
- the ESD protection device according to claim 1 that is connected to the first coil and the second coil, on a surface of or inside the multilayer body.

14. The common mode choke coil with a built-in ESD protection device according to claim 13, wherein the ESD protection device is located at an inner side of a coil cavity of the first coil and the second coil in a planar view in a winding axis direction of the first coil and the second coil.

15. The common mode choke coil with a built-in ESD protection device according to claim 14, wherein a line width of a portion of the ground electrode that overlaps with the first coil and the second coil includes a thinned portion when viewed in the lamination direction of the base material layers.

16. The common mode choke coil with a built-in ESD protection device according to claim 14, wherein the first coil and the second coil include first and second loop conductors defining electrodes with a same length or substantially a same length.

17. The common mode choke coil with a built-in ESD protection device according to claim 14, further comprising another ESD protection device, wherein the ESD protection device is provided in a subsequent stage of the first coil and the another ESD protection device is provided in a subsequent stage of the second coil.

18. The common mode choke coil with a built-in ESD protection device according to claim 14, further comprising a plurality of input-output terminals provided on an outer surface of the multilayer body.

19. A common mode choke coil apparatus comprising:
- two of the common choke coil according to claim 14 including circuit configurations that are right-left symmetric.

* * * * *